United States Patent
Tsai et al.

(10) Patent No.: US 11,670,547 B2
(45) Date of Patent: Jun. 6, 2023

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventors: Yu-Ting Tsai, New Taipei (TW); Chung-Liang Cheng, Changhua County (TW); Ching-Jing Wu, Zaoqiao Township (TW); Chyi-Tsong Ni, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 62 days.

(21) Appl. No.: 17/149,997

(22) Filed: Jan. 15, 2021

(65) Prior Publication Data
US 2022/0230914 A1    Jul. 21, 2022

(51) Int. Cl.
*H01L 21/768* (2006.01)
*H01L 23/535* (2006.01)
*H01L 23/532* (2006.01)

(52) U.S. Cl.
CPC .. *H01L 21/76843* (2013.01); *H01L 21/76805* (2013.01); *H01L 21/76876* (2013.01); *H01L 21/76895* (2013.01); *H01L 23/535* (2013.01); *H01L 23/53266* (2013.01)

(58) Field of Classification Search
CPC ............... H01L 21/76876; H01L 21/76895
See application file for complete search history.

(56) References Cited

U.S. PATENT DOCUMENTS

| | | | |
|---|---|---|---|
| 2005/0196534 A1* | 9/2005 | Hatano | C23C 16/45527 427/248.1 |
| 2010/0320607 A1 | 12/2010 | Suzuki | |
| 2017/0148670 A1* | 5/2017 | Lei | H01L 21/76877 |
| 2017/0330829 A1 | 11/2017 | Wu et al. | |
| 2018/0211873 A1 | 7/2018 | Witt | |

FOREIGN PATENT DOCUMENTS

| | | |
|---|---|---|
| DE | 102015111257 A1 | 12/2016 |
| EP | 0954016 A2 | 11/1999 |
| TW | 202008509 A | 2/2020 |

OTHER PUBLICATIONS

Vladislav V. Krisyuk, et al., "Thermal decomposition of tungsten hexacarbonyl: CVD of W-containing films under Pd codeposition and VUV assistance", Physica Status Solidi, Jun. 8, 2015, pp. 1047-1052, vol. 12, No. 7.

* cited by examiner

*Primary Examiner* — Farun Lu
(74) *Attorney, Agent, or Firm* — Cooper Legal Group, LLC

(57) ABSTRACT

A semiconductor arrangement is provided. The semiconductor arrangement includes a dielectric layer defining an opening, an adhesion layer in the opening, and a conductive layer in the opening over the adhesion layer. A material of the conductive layer is a same material as an adhesion material of the adhesion layer.

20 Claims, 12 Drawing Sheets

| Parameter | Stage 1 | Stage 2 | Stage 3 | Stage 4 |
|---|---|---|---|---|
| Chamber | SAME | | | |
| Time per Stage (secs) | 5 | 2 | 5 | 2 |
| Pressure (torr) | 15 | 1.5 | 1.5 | 1.5 |
| RF Power (watts) | 1~10 | 1~10 | 100~300 | 100~300 |
| Heater Temperature (deg C) | 180~220 | | | |
| 1st Flow Rate (sccm)* | 600~800 | 2000~6000 | | |
| 2nd Flow Rate (sccm)** | | >3000 | >3000 | >3000 |

*Flow Rate of first treatment material 712

**Flow Rate of second treatment material 716

SEMICONDUCTOR ARRANGEMENT AND METHOD OF MAKING

BACKGROUND

Semiconductor arrangements are used in a multitude of electronic devices, such as mobile phones, laptops, desktops, tablets, watches, gaming systems, and various other industrial, commercial, and consumer electronics. The dimensions of components of semiconductor arrangements have been decreasing as the density of components within semiconductor arrangements has been increasing. Interconnects are configured to carry signals to and from different components within semiconductor arrangements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
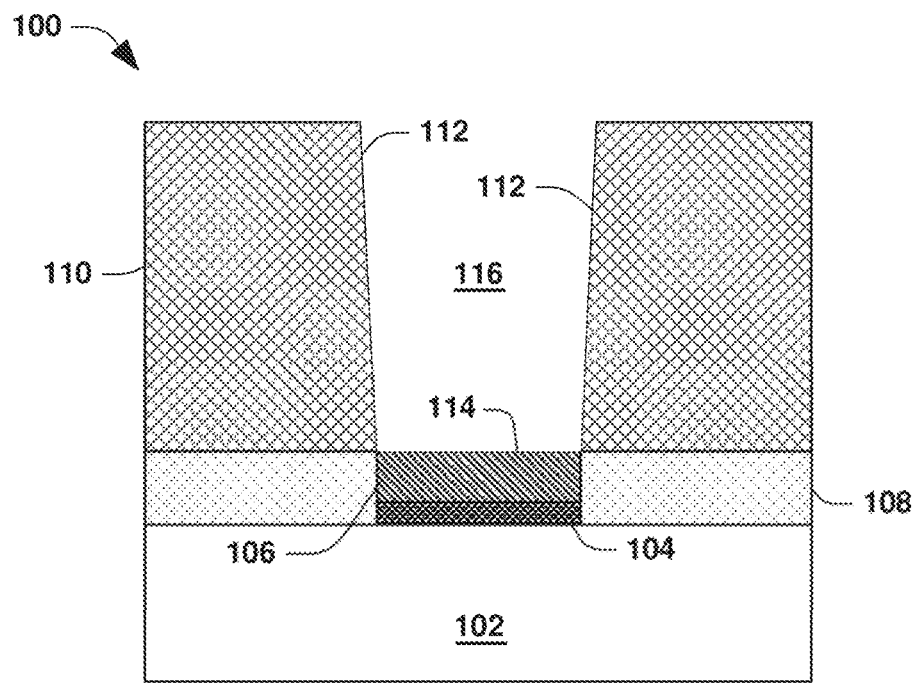
FIGS. 1-6 are illustrations of a semiconductor arrangement at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

One or more semiconductor arrangements are provided herein. A semiconductor arrangement includes a dielectric layer formed over an underlying conductive feature, such as a gate structure. An opening is formed in the dielectric layer to expose at least an upper surface of the underlying conductive feature. An adhesion layer of an adhesion material, such as tungsten, is formed on sidewalls of the dielectric layer defining the opening and on the upper surface of the underlying conductive feature. The adhesion layer is formed by a process that also removes oxides from the upper surface of the underlying conductive feature, from the sidewalls defining the opening, and/or from the adhesion layer. A conductive layer of the same material as the adhesion material is formed in the opening and over the adhesion layer. The conductive layer may form a contact plug, a vertical interconnect access plug, or other conductive structure. The removal of oxides from the upper surface of the underlying conductive feature, from the sidewalls defining the opening, and/or from the adhesion layer reduces electrical resistance at an interface of the underlying conductive feature and the conductive layer for improved conductivity and/or signal strength through the interface. Removal of oxides also improves semiconductor arrangement reliability and increases semiconductor arrangement yield due to, as an example, adequate conductivity.

Because the adhesion material is the same material as the material of the conductive layer, a diffusion barrier layer is not required between the adhesion layer and the conductive layer. Because a diffusion barrier layer is not required, the area in which the conductive layer is formed is greater than in arrangements in which one or more diffusion barrier layers are present. In the disclosed semiconductor arrangement, the conductive layer is thicker than conductive layers formed over diffusion barrier layers. The thicker conductive layer has greater conductivity than conductive layers formed within openings that include diffusion barrier layers.

The process for forming the adhesion layer includes depositing into the opening a precursor of the adhesion material of the adhesion layer and a plasma. The plasma removes native oxides from the upper (contact) surface of the underlying conducive feature to facilitate/improve conductivity at the interface of the underlying conductive feature and the conductive layer. The precursor of the adhesion material is a gaseous form of the material of the conductive layer. For example, the precursor of the adhesion material is the material of the conductive layer (such as tungsten) having ligands (such as carbon monoxide molecules) attached thereto. After the precursor of the adhesion material is deposited into the opening, bombarding atoms or molecules separate the ligands from the adhesion material. The adhesion material, no longer in gas form, forms the adhesion layer over the upper surface of the underlying conductive feature and on the sidewalls of the opening. The process of depositing the precursor of the adhesion material and the plasma into the opening may be performed cyclically until the adhesion layer is formed to a predetermined thickness.

FIGS. 1-6 are illustrations of a semiconductor arrangement at various stages of fabrication, according to some embodiments. Some embodiments described herein are in the context of Back End Of the Line (BEOL) processing of semiconductor arrangements. Some embodiments described herein are in the context of Middle End Of the Line (MEOL) processing of semiconductor arrangements. Some embodiments described herein are in other contexts of semiconductor arrangements.

Turning to FIG. 1, at least some of a semiconductor arrangement 100 is formed on and/or includes a substrate 102. The substrate 102 comprises at least one of an epitaxial layer, a silicon-on-insulator structure, a wafer, a die formed from a wafer, or other suitable structures. In some embodiments, the substrate 102 comprises at least one of silicon, germanium, carbide, gallium, arsenide, germanium, arsenic, indium, oxide, sapphire, or other suitable materials.

A first dielectric layer 104 is formed over the substrate 102 by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. The first dielectric layer 104 comprises at least one of a metal nitride, a high-k dielectric, a rare earth oxide, an aluminate of a rare earth oxide, a silicate of a rare earth oxide, or other suitable materials. According to some embodiments, the first dielectric layer 104 comprises at least one of silicon nitride (SiN), $Si_3N_4$, silicon dioxide ($SiO_2$), titanium dioxide ($TiO_2$), tantalum pentoxide ($Ta_2O_5$), zirconium dioxide ($ZrO_2$), yttrium oxide ($Y_2O_3$), hafnium dioxide ($HfO_2$), or other suitable materials.

A conductive feature 106 is formed over the first dielectric layer 104. The conductive feature 106 is formed using suitable processes including photolithography and etching processes. According to some embodiments, the conductive feature 106 is a gate formed by disposing a gate material over the first dielectric layer 104 and the substrate 102. The gate material is formed by at least one of PVD, sputtering, CVD, LPCVD, ALCVD, UHVCVD, RPCVD, MBE, LPE, flowable CVD (FCVD), or other suitable techniques. A photoresist layer (not shown) is formed over the gate material. The photoresist layer is exposed, such as to light, and subjected to one or more developing processes to yield a patterned photoresist or masking element. The masking element protects portions of the gate material while an etching process forms the gate over the first dielectric layer 104 by removing portions of the gate material that are not protected by the masking element. The masking element is removed by at least one of etching or other suitable techniques. In some embodiments, the conductive feature 106 is a feature of a metal-oxide-semiconductor field-effect transistor (MOSFET), a fin field-effect transistor (FinFET), a bipolar junction transistor, a diode, a resistor, a capacitor, or other electronic component, where a photoresist layer can similarly be implemented as described.

A second dielectric layer 108 is formed over the substrate 102. The second dielectric layer 108 may be formed by at least one of PVD, sputtering, CVD, LPCVD, ALCVD, UHVCVD, RPCVD, MBE, LPE, flowable CVD (FCVD), or other suitable techniques. In some embodiments, the second dielectric layer 108 comprises at least one of a metal nitride, a high-k dielectric, a rare earth oxide, an aluminate of a rare earth oxide, a silicate of a rare earth oxide, SiN, $SiO_2$, $Si_3N_4$, $TiO_2$, $Ta_2O_5$, $ZrO_2$, $Y_2O_3$, $La_2O_5$, $HfO_2$, or other suitable materials. The second dielectric layer can be formed after at least one of the first dielectric layer 104 or the conductive feature 106 is formed, where some of the second dielectric layer overlying at least one of the first dielectric layer 104 or the conductive feature 106 would be removed, such as by etching, chemical mechanical polishing (CMP), etc. The second dielectric layer can be formed before at least one of the first dielectric layer 104 or the conductive feature 106 is formed, where some of the second dielectric layer would be removed, such as by etching, etc., from a location where at least one of the first dielectric layer 104 or the conductive feature 106 would be formed.

A third dielectric layer 110 is formed over the substrate 102. The third dielectric layer 110 may be formed by at least one of PVD, sputtering, CVD, LPCVD, ALCVD, UHVCVD, RPCVD, MBE, LPE, or other suitable techniques. In some embodiments, the third dielectric layer 110 comprises at least one of a metal nitride, a high-k dielectric, a rare earth oxide, an aluminate of a rare earth oxide, a silicate of a rare earth oxide, SiN, $SiO_2$, $Si_3N_4$, $TiO_2$, $Ta_2O_5$, $ZrO_2$, $Y_2O_3$, $La_2O_5$, $HfO_2$, or other suitable materials.

An opening 116 is formed in the third dielectric layer 110. In some embodiments, the opening 116 is formed by removing a portion of the third dielectric layer 110 by at least one of etching or other suitable techniques. The opening 116 is defined by one or more sidewalls 112 of the third dielectric layer 110 and an upper surface 114 of the conductive feature 106. The conductive feature 106 is exposed through the opening 116.

Figure 2:
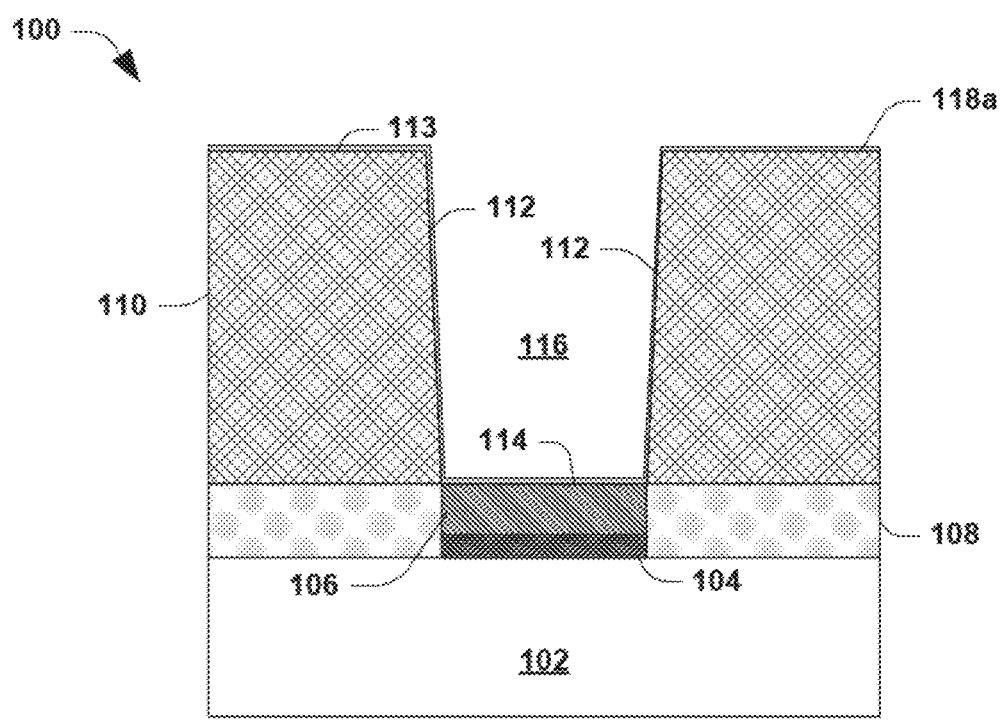

Referring to FIG. 2, a first adhesive coating 118a of an adhesion material is formed over at least one of one or more of the one or more sidewalls 112, the upper surface 114 of the conductive feature 106, or an upper surface 113 of the third dielectric layer 110. According to some embodiments, the first adhesive coating 118a is formed in a processing chamber (not shown) by depositing into the opening 116 a precursor of the adhesion material in a gaseous state and at least one of a first plasma of a first treatment material in a gaseous state or a second plasma of a second treatment material in a gaseous state. At least one of the first plasma or the second plasma is formed by subjecting at least one of the first treatment material or the second treatment material to at least one of an electric field or a magnetic field at least one of above or in the opening 116. In some embodiments, at least one of the electric field or the magnetic field is a radio frequency field (RF field). Within at least one of the electric field or the magnetic field, at least one of the first treatment material or the second treatment material is ionized to form at least one of the first plasma or the second plasma. The first plasma comprises the first treatment material in an ionized state and electrons, and the second plasma comprises the second treatment material in an ionized state and electrons. When each of the precursor of the adhesion material, the first treatment material, and the second treatment material flow into the processing chamber, through at least one of the electric field or the magnetic field, and over the third dielectric layer 110, the first adhesive coating 118a of the adhesion material forms over at least one of one or more of the one or more sidewalls 112, the upper surface 114 of the conductive feature 106, or the upper surface 113 of the third dielectric layer 110.

According to some embodiments, the precursor of the adhesion material comprises carbon monoxide (CO) ligands attached to an adhesion atom or molecule, the adhesion material is tungsten (W), the precursor of the adhesion material is tungsten hexacarbonyl ($W(CO)_6$), the first treatment material is argon (Ar), the second treatment material is molecular hydrogen ($H_2$), the first plasma comprises ionized Ar, and the second plasma comprises ionized H. Within the processing chamber, Ar atoms dislodge native oxides from at least one of one or more of the one or more sidewalls 112, the upper surface 114 of the conductive feature 106, or the upper surface 113 of the third dielectric layer 110, and $H_2$ molecules react with the dislodged native oxides to form $H_2O$ molecules. The $H_2O$ molecules are purged from the opening 116 under a high-pressure treatment. In some embodiments, the rate of flow of at least one of the first treatment material or the second treatment material is sufficient to bombard the precursor of the adhesion material. Energy from the bombarding treatment material(s) separates the ligands from the adhesion material, and the separated adhesion material forms the first adhesive coating 118a. Other materials of the ligands, the precursor of the adhesion material, the adhesion material, the first treatment material, the second treatment material, the first plasma, and the second plasma are within the scope of the disclosure.

Figure 3:
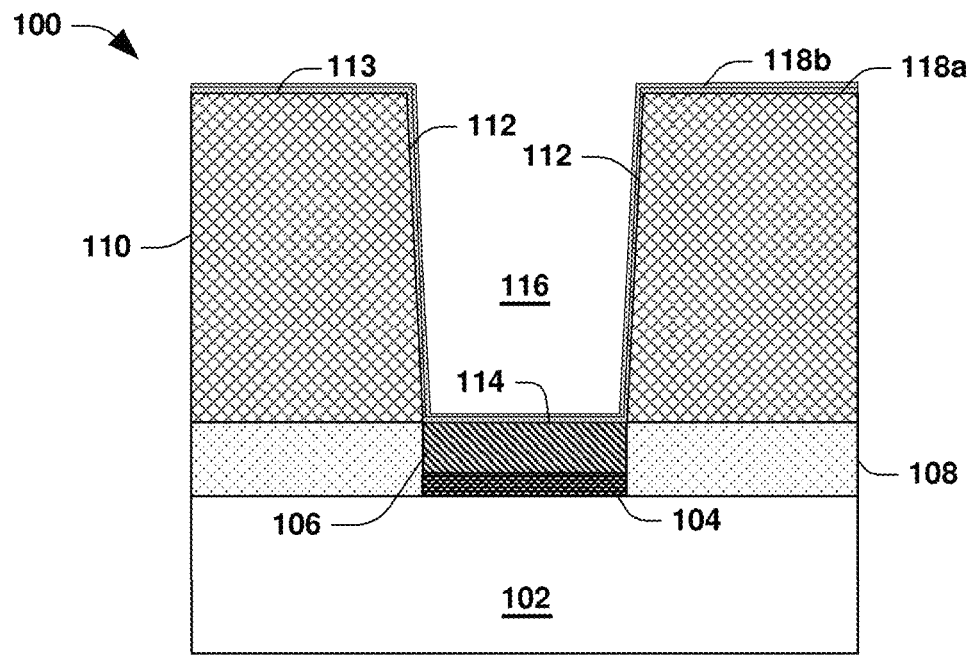

Referring to FIG. 3, a second adhesive coating 118b of the adhesion material is formed over the first adhesive coating 118a including over at least one of one or more of the one or more sidewalls 112, the upper surface 114 of the conductive feature 106, or the upper surface 113 of the third dielectric layer 110. The second adhesive coating 118b is formed by depositing into the opening 116 at least one of the precursor of the adhesion material, the adhesion material, the first treatment material, the second treatment material, the first plasma, or the second plasma. According to some embodiments, the second adhesive coating 118b forms in a manner similar to the formation of the first adhesive coating 118a.

Figure 4:
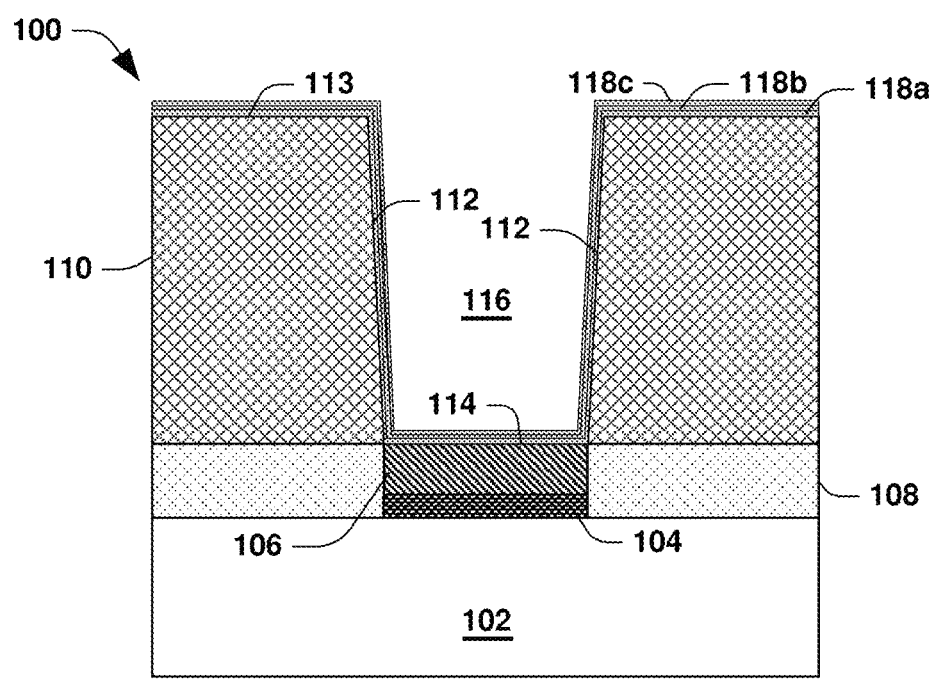

Referring to FIG. 4, a third adhesive coating 118c of the adhesion material is formed over the second adhesive coating 118b including over at least one of the first adhesive coating 118a, one or more of the one or more sidewalls 112, the upper surface 114 of the conductive feature 106, or the upper surface 113 of the third dielectric layer 110. The third adhesive coating 118c is formed by depositing into the opening 116 at least one of the precursor of the adhesion material, the adhesion material, the first treatment material, the second treatment material, the first plasma, or the second plasma. According to some embodiments, the third adhesive coating 118c forms in a manner similar to the formation of the first adhesive coating 118a.

Additional adhesive coatings may be formed in the manner described above and/or in other suitable manners. In some embodiments, at least one of a predetermined number of adhesive coatings are formed to attain a predetermined thickness of the adhesion material, adhesive coatings are formed in layers for a predetermined time period, or other criteria are used to determine a quantity of adhesion material for forming overlapping adhesive coatings over the sidewalls 112 and the upper surface 114 of the conductive feature 106.

Figure 5:
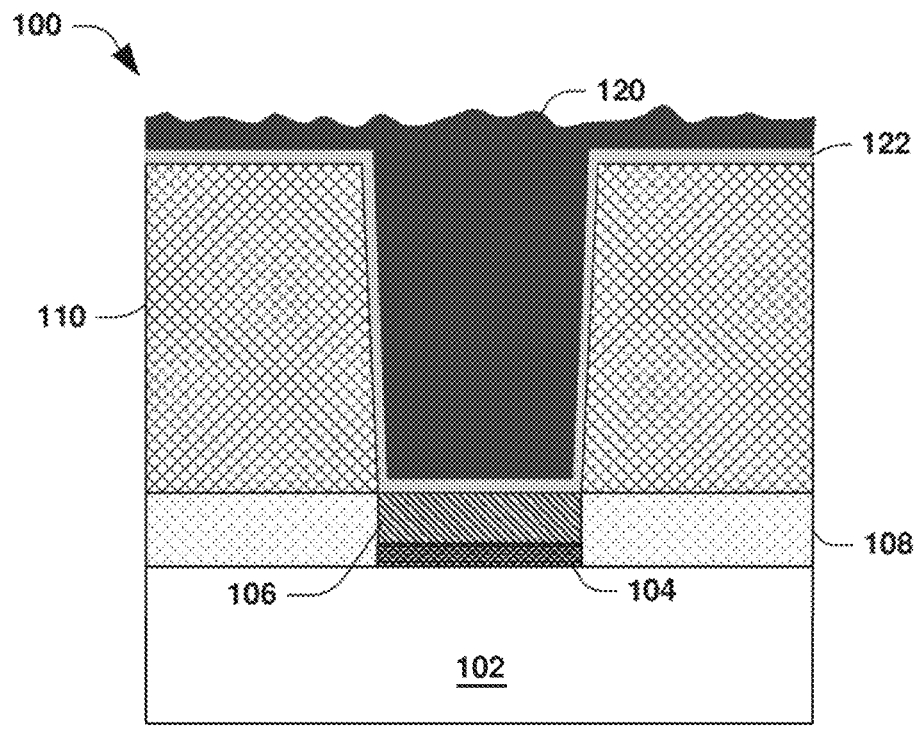

Referring to FIG. 5, the first adhesive coating 118a, the second adhesive coating 118b, and the third adhesive coating 118c together form an adhesion layer 122 of the adhesion material that overlies the conductive feature 106, the one or more sidewalls 112, and the upper surface 113 of the third dielectric layer 110. The adhesion layer 122 may be in direct or indirect contact with the conductive feature 106. The adhesion layer 122 may be in direct or indirect contact with at least one of the first sidewall 112 or the second sidewall 112.

After the formation of the adhesion layer 122, a conductive layer 120 of the adhesion material is formed in the opening 116. The adhesion layer 122 may be a seed layer for the formation of the conductive layer 120. The adhesion material of the conductive layer 120 is formed into the opening 116 by a suitable process, such as at least one of electro-chemical plating (ECP), CVD, PVD, atomic layer deposition (ALD), sputtering, or e-beam evaporation. In some embodiments, between 55 to 75 percent of the volume of the opening 116 is occupied by the conductive layer 120.

Figure 6:
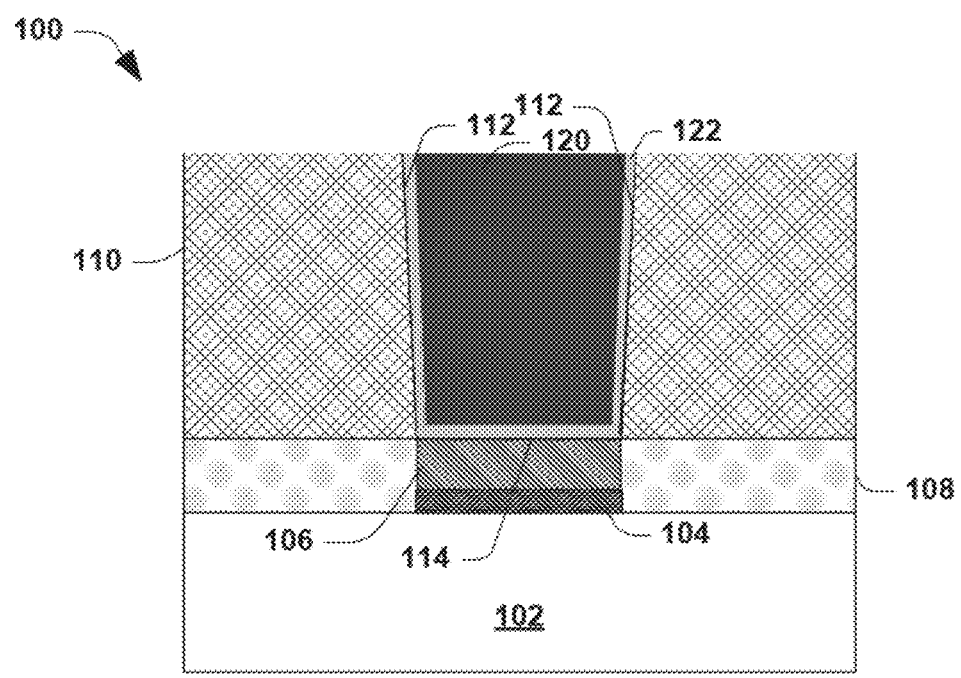

Referring to FIG. 6, at least one of the conductive layer 120, the adhesion layer 122, or the third dielectric layer 110 are planarized to form a planar topography. According to some embodiments, planarization includes one or more of CMP, etching, or other suitable process performed to remove material. The remaining conductive layer 120 may be a contact plug, a vertical interconnect access plug, or other conductive structure.

FIGS. 7-11 are illustrations of a method for forming a semiconductor arrangement, according to some embodiments. Several features of the semiconductor arrangement 100 illustrated in FIGS. 7-10 are the same or similar to features of the semiconductor arrangement 100 illustrated and described with reference to FIGS. 1-6. Descriptions and methods of formation of the same or similar features in FIGS. 7-10 are omitted to avoid repetition of disclosure.

Each of FIGS. 7-10 illustrates several components of a deposition chamber that are used for forming the adhesion layer 122 over at least one of one or more of the one or more sidewalls 112, the upper surface 114 of the conductive feature 106, or the upper surface 113 of the third dielectric layer 110. For clarity of disclosure, several other components of a deposition chamber, such as a housing structure, conduits, and a wafer holding component are not illustrated.

Figure 7:
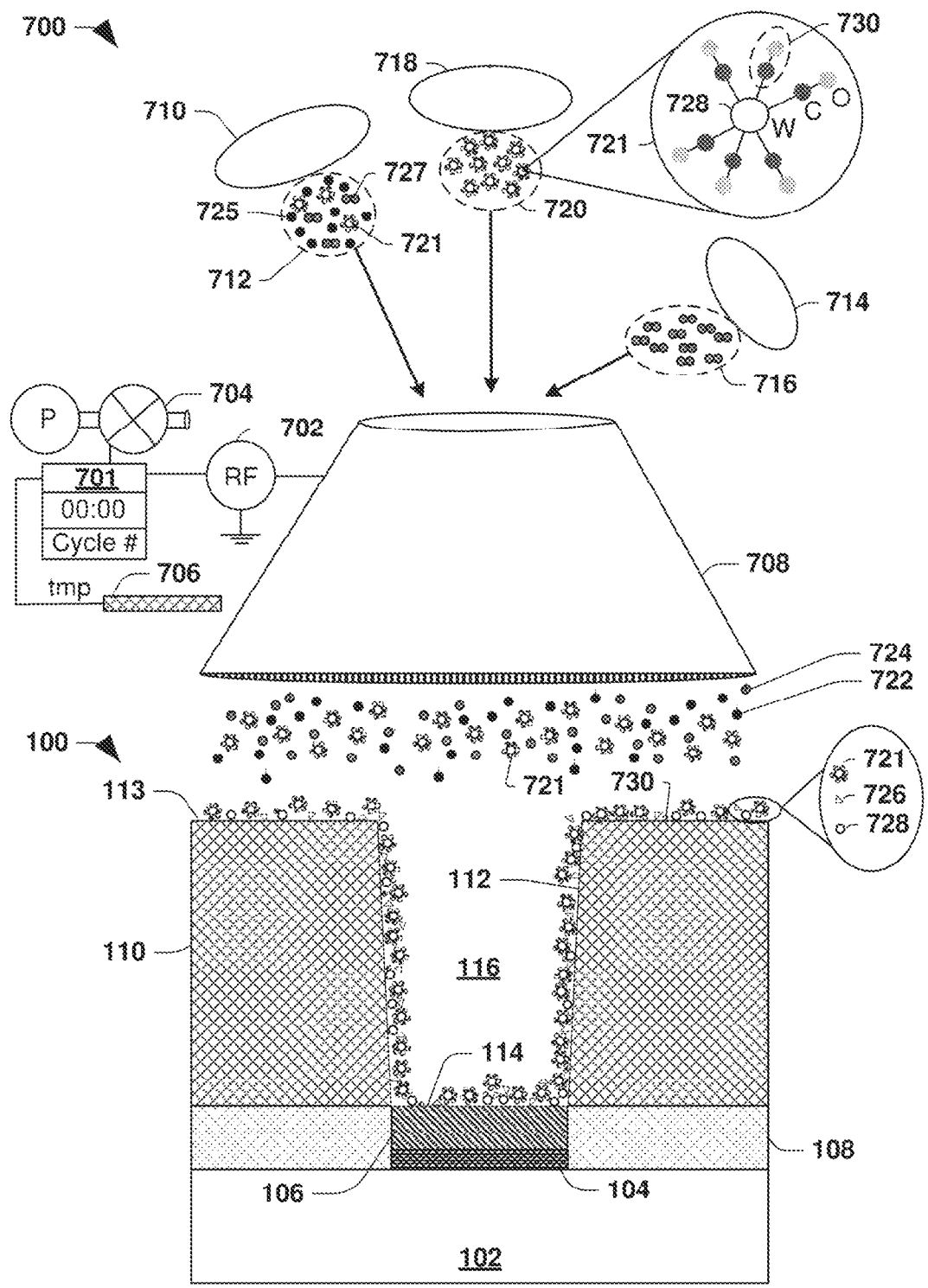
FIGS. 7-11 are illustrations of a method for forming a semiconductor arrangement, according to some embodiments.

Turning to FIG. 7, a controller 701 is programmable and/or configured to receive commands directed to forming the adhesion layer 122. The controller 701 is configured to communicate with at least one of a radio frequency (RF) signal generator 702, a pressure valve 704, or a heat source 706. The controller 701 regulates the power level provided by the RF signal generator 702. The RF signal generator 702 generates an electromagnetic field within a showerhead 708. The controller 701 regulates the power level output by the RF signal generator 702 in accord with a degree or amount of plasma formation sufficient to perform one or more stages of adhesion layer 122 formation. For example, a stage in the formation of the adhesion layer 122 may utilize an amount of a treatment material output from the showerhead 708 that is greater than an amount of plasma generated from the treatment material and output from the showerhead 708. Another stage may utilize an amount of plasma generated from the treatment material and output from the showerhead 708 that is greater than an amount of treatment material output from the showerhead 708. The controller 701 regulates the power level output by the RF signal generator 702 accordingly.

The controller 701 regulates the pressure valve 704 in accord with a degree or range of pressure sufficient to perform one or more stages of adhesion layer 122 formation. For example, a stage in the formation of the adhesion layer 122 may be performed at a different pressure than another stage. The controller 701 may generate commands to control the pressure valve 704 accordingly.

The controller 701 regulates the heat source 706 in accord with a temperature or range of temperature sufficient to perform one or more stages of adhesion layer 122 formation. The controller 701 may also regulate the heat source 706 to maintain a temperature or temperature range throughout one or more or all stages in the formation of the adhesion layer 122. For example, some stages may be performed within a first temperature range, and other stages may be performed within a second temperature range, different than the first temperature range. The controller 701 may generate commands to control the heat source 706 accordingly.

The controller 701 may also include at least one of a timer or cycle counter for use in controlling at least one of the duration of one or more stages and/or the time of adhesion layer 122 formation or the number of cycles performed to form the adhesion layer 122 to a predetermined thickness.

In some embodiments, the controller 701 regulates at least one of a first flow regulator 710 to control a first flow rate of a first treatment material 712 into the showerhead 708, a second flow regulator 714 to control a second flow rate of a second treatment material 716 into the showerhead 708, a third flow regulator 718 to control a third flow rate of a precursor of an adhesion material 720 into the showerhead 708, or other flow regulators to control other flow rates of materials, such as into the showerhead. According to some embodiments, the precursor of the adhesion material 720 is a metal organic based precursor material 721 such as $W(CO)_6$. When the adhesion material 720 is a metal organic based precursor material respective molecules have, for example, one part tungsten and six parts carbon (C) and oxygen (O), where the tungsten serves as the adhesion material 728 and the carbon and oxygen are ligands 730.

FIG. 7 is an illustration of a first stage 700 of a method for forming the semiconductor arrangement 100, according to some embodiments. In the first stage 700, the pressure in the deposition chamber is set high relative to the pressure in the deposition chamber at other stages. The high pressure facilitates a high deposition rate of the precursor of the adhesion material 720 into the opening 116 and over at least one of one or more of the one or more sidewalls 112, the upper surface 114 of the conductive feature 106, or the upper surface 113 of the third dielectric layer 110.

In the first stage 700, the RF signal generator 702 generates a low power level relative to the power level at other stages. The low power level generates an electromagnetic field within the showerhead 708 that is weaker than the electromagnetic field generated within the showerhead 708 at other stages. The electromagnetic field generated in the first stage 700 generates a first plasma 722 (represented by a black dot with a small vertical line) from the first treatment material 712 and generates a second plasma 724 (represented by a shaded dot with a small vertical line) from the second treatment material 716. At least one of the first plasma 722 or the second plasma 724 reacts with the precursor of the adhesion material 720 and separates ligands 730 from some of the precursors of the adhesion material 720. In some embodiments, in the first stage 700 at least one of the first flow rate of the first treatment material 712 or the second flow rate of the second treatment material 716 is set lower than in other stages. Lower flow rates of at least one of the first treatment material 712 or the second treatment material 716 and the low power level limit the number of reactions that separate the ligands 730 from the adhesion material 728. According to some embodiments, the first treatment material 712 includes at least one of a carrier material 725, such as Ar, a purge material 727, such as $H_2$, or the precursor of the adhesion material 720. In some embodiments, the second treatment material is $H_2$. In some embodiments, the formula for the reaction between $W(CO)_6$ and $H_2$ for separating the ligands 730 from the adhesion material 728 is:

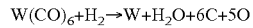

$$W(CO)_6 + H_2 \rightarrow W + H_2O + 6C + 5O$$

In FIG. 7, the C and O atoms are byproducts 726, represented by a clear triangle. Single atoms of the carrier material 725, such as Ar, represented by a black dot (without a vertical line), and single atoms of the purge material 727 and/or the second treatment material 716, such as H, represented by a shaded dot (without a vertical line), are intermixed with the first plasma 722 and the second plasma 724.

Figure 16:
FIG. 16 is a table that includes examples of parameter values for stages of making a semiconductor arrangement, according to some embodiments.

FIG. 16 is a table 1600 that includes examples of parameter values for stages of making the semiconductor arrangement 100, including Stage 1 1602 which corresponds to the first stage 700, according to some embodiments.

Figure 8:
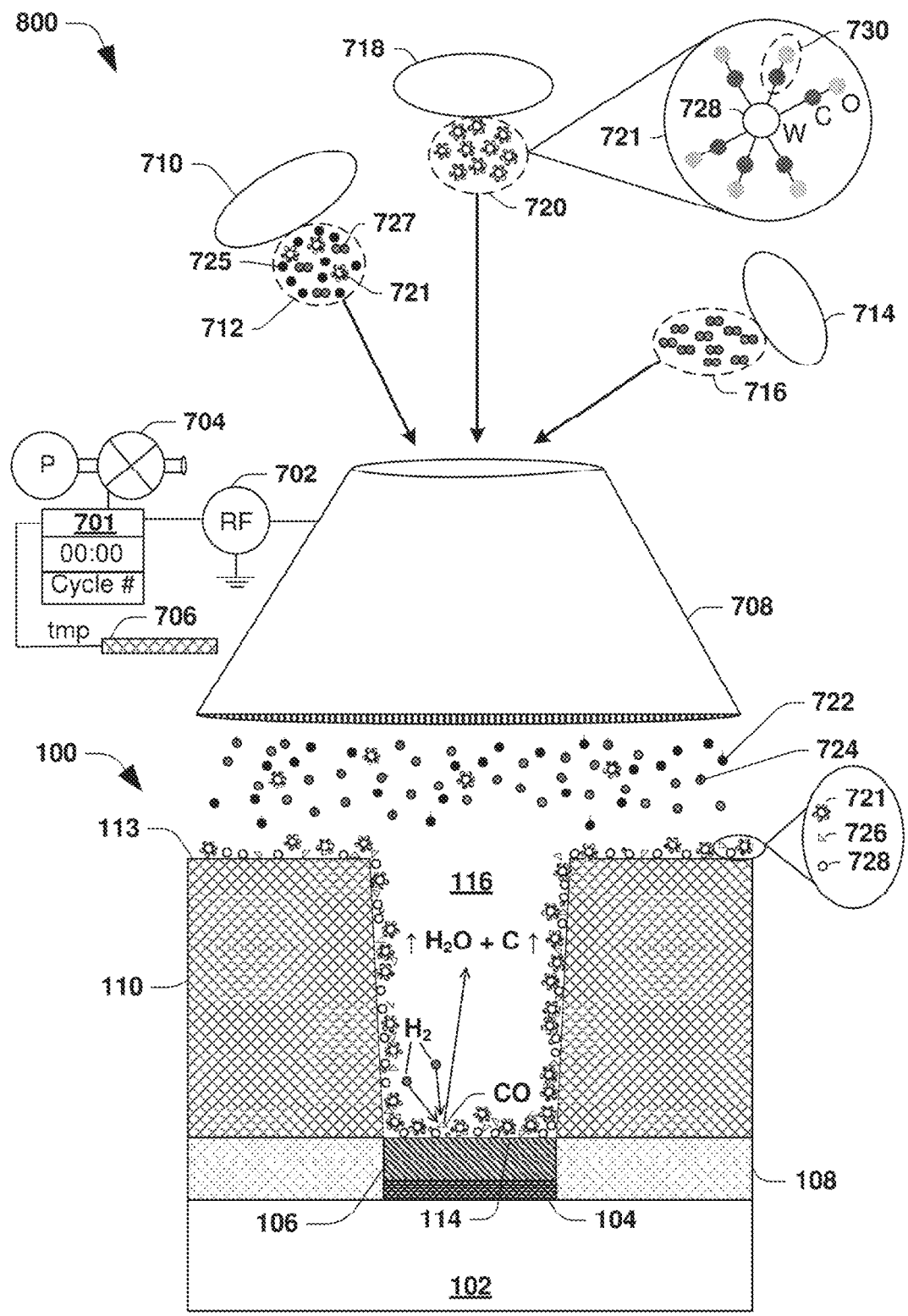

FIG. 8 is an illustration of a second stage 800 of a method for forming the semiconductor arrangement 100, according to some embodiments. In the second stage 800, the pressure in the deposition chamber is lowered from the pressure in the deposition chamber during the first stage 700 and the second flow rate of the second treatment material 716 is increased. Increasing the second flow rate of the second treatment material 716 increases the rate of removal of oxides, such as carbon monoxide (CO), from at least one of one or more of the one or more sidewalls 112, the upper surface 114 of the conductive feature 106, or the upper surface 113 of the third dielectric layer 110. In some embodiments, the formula for the reaction between the second treatment material 716 and oxides at the upper surface 114 of the conductive feature 106 is:

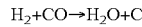

$$H_2 + CO \rightarrow H_2O + C$$

Lowering the pressure between the first stage 700 and the second stage 800 purges $H_2O$, C, and other byproducts from the opening 116, such as is illustrated in FIG. 8.

Figure 9:
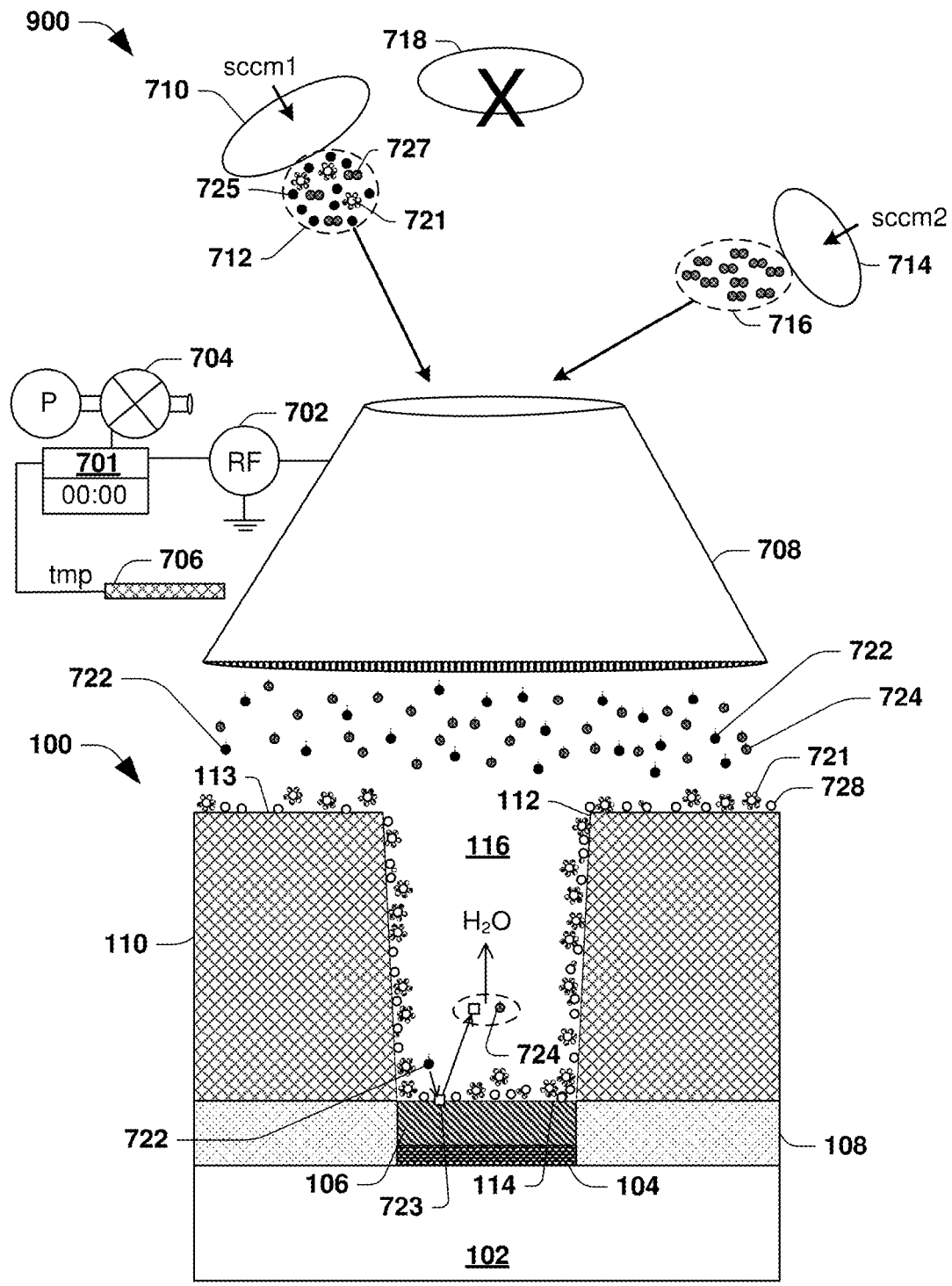

FIG. 9 is an illustration of a third stage 900 of a method for forming the semiconductor arrangement 100, according to some embodiments. In the third stage 900, the third flow regulator 718 closes to prevent precursors of the adhesion material 720 from entering the showerhead 708. The RF signal generator 702 increases the power level output to the showerhead 708. Increasing the power level increases the strength of the electromagnetic field within the showerhead 708. Increasing the strength of the electromagnetic field within the showerhead 708 increases the generation (quantity) of the first plasma 722 and the second plasma 724. The first flow regulator 710 maintains a relatively high standard cubic centimeter per minute flow rate of the first treatment material 712 (sccm1) toward the showerhead 708, and the second flow regulator 714 maintains a relatively high standard cubic centimeter per minute flow rate of the second treatment material 716 (sccm2) toward the showerhead 708.

In the third stage 900, the first plasma 722 dislodges native oxides 723 (represented by a clear square) that are naturally occurring in at least one of one or more of the one or more sidewalls 112, the upper surface 114 of the conductive feature 106, or the upper surface 113 of the third dielectric layer 110, and the second plasma 724 reacts with the dislodged native oxides to form $H_2O$ molecules, such as is illustrated in FIG. 9. Also, the first plasma 722 and the second plasma 724 bombard the precursor of the adhesion material 720 on at least one of one or more of the one or more sidewalls 112, the upper surface 114 of the conductive feature 106, or the upper surface 113 of the third dielectric layer 110. Due to at least the increase in quantity of first plasma 722 and the increase in quantity of the second plasma 724, the energy of the bombardment separates a substantial number of ligands 730 from a substantial number of atoms or molecules of the adhesion material 728, such as tungsten.

Figure 10:
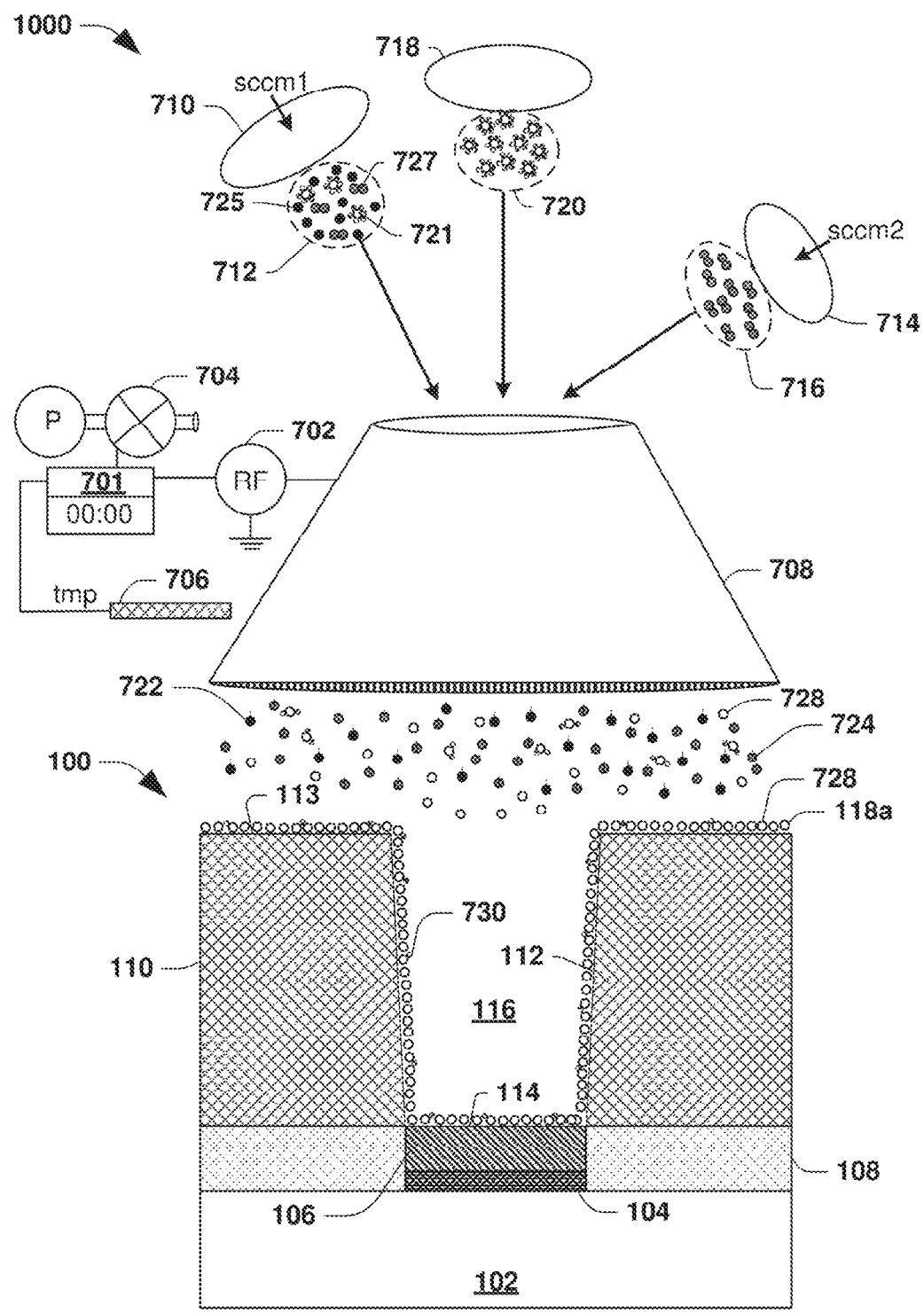

FIG. 10 is an illustration of a fourth stage 1000 of a method for making the semiconductor arrangement 100, according to some embodiments. An outcome of the bombardment of the precursor of the adhesion material 720 by the first plasma 722 and the second plasma 724, as explained with reference to FIG. 9, is shown in FIG. 10. FIG. 10 illustrates that at least nearly all of the ligands 730 and byproducts 726 have been removed, forming the first adhesive coating 118a of the adhesion material 728 over at least one of one or more sidewalls 112, the upper surface 114 of the conductive feature 106, or the upper surface 113 of the third dielectric layer 110.

In the fourth stage 1000, the third flow regulator 718 is opened to allow precursors of the adhesion material 720 to enter the showerhead 708. The first flow regulator 710 maintains a relatively high standard cubic centimeter per minute flow rate of the first treatment material 712 (sccm1), and the second flow regulator 714 maintains a relatively high standard cubic centimeter per minute flow rate of the second treatment material 716 (sccm2). In the area between the showerhead 708 and the semiconductor arrangement 100, the first plasma 722 and the second plasma 724 bombard the precursor of the adhesion material 720. The bombardment separates the ligands 730 from the adhesion material 728. The adhesion material 728 descends onto the semiconductor arrangement 100 and onto at least one of one or more sidewalls 112, the upper surface 114 of the conductive feature 106, or the upper surface 113 of the third dielectric layer 110. The first adhesive coating 118a of the adhesion material 728 acts as a seed layer and bonds with the descended adhesion material 728 to have an increased thickness.

In some embodiments, the method cycles through the first through fourth stages to form additional adhesive coatings, such as 118b, 118c, etc. described above. In some embodiments, a predetermined number of adhesive coatings are formed to attain a predetermined thickness "T" of adhesion material over at least one of one or more sidewalls 112, the upper surface 113 of the third dielectric layer 110, or the upper surface 114 of the conductive feature 106. According to some embodiments, T=30 angstroms (A).

Figure 11:
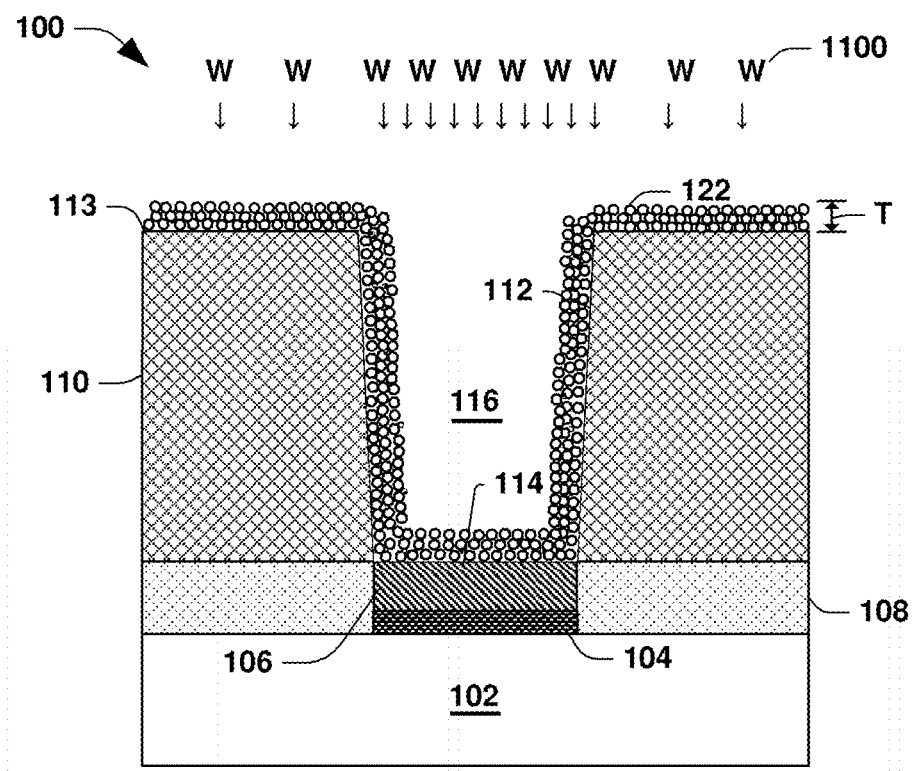

Referring to FIG. 11, one or more adhesive coatings form the adhesion layer 122 having the thickness T. The adhesion layer 122 acts as a seed layer and bonds with a conductive layer material 1100 which forms the conductive layer 120 (FIGS. 5 and 6) to establish a contact plug, a vertical interconnect access plug, or other conductive structure. The conductive layer material 1100 is a same material as the material of the adhesion layer 122.

With reference to FIGS. 7-11, according to some embodiments the precursor of the adhesion material 720 comprises CO ligands, the adhesion material 728 comprises W, the precursor of the adhesion material 720 is $W(CO)_6$, the first treatment material 712 includes at least one of a carrier material, such as Ar, a purge material, such as $H_2$, or the precursor of the adhesion material 720, the second treatment material 716 is $H_2$, the first plasma 722 comprises ionized Ar, and the second plasma 724 comprises ionized H. In some embodiments, the precursor of the adhesion material 720 and the conductive layer material 1100 comprise one or more of cobalt (Co), ruthenium (Ru), iridium (Ir), or other suitable material.

Figure 12:
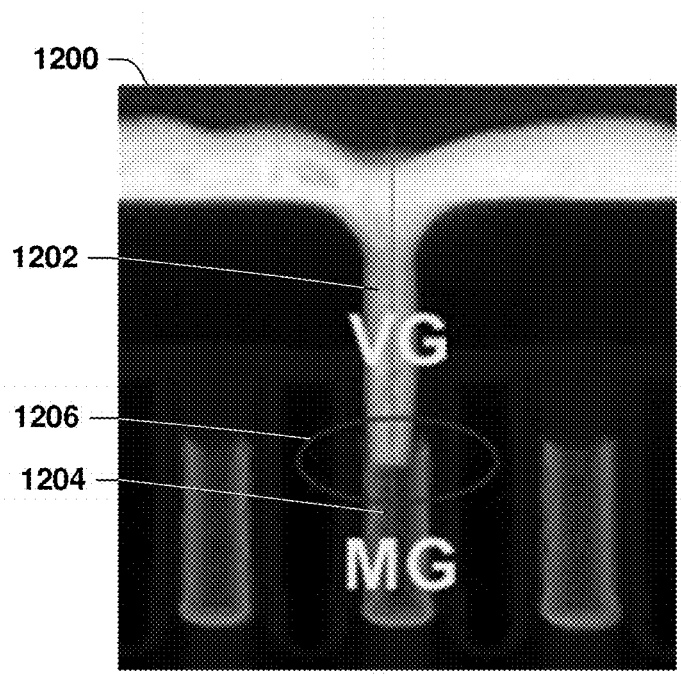
FIG. 12 is an image of a structure of a semiconductor arrangement, according to some embodiments.

Referring to FIG. 12, an image of a conductive structure 1200 is shown. The conductive structure 1200 was formed by applying a same material of a conductive layer (VG) 1202 as a material of an adhesion layer (present but imperceptible in FIG. 12). The conductive layer 1202 was formed over a metal gate (MG) 1204 at an interface 1206. A ratio of oxygen to a material of the metal gate (MG) 1204, such as titanium (Ti), at the upper surface of the metal gate 1204 was measured to be less than 0.5 (1:2). In some embodiments, the conductive layer 1202 corresponds to the conductive layer 120 illustrated in FIGS. 5 and 6. In some embodiments, the metal gate (MG) corresponds to the conductive feature 106 illustrated in FIGS. 1-11.

Figure 13:
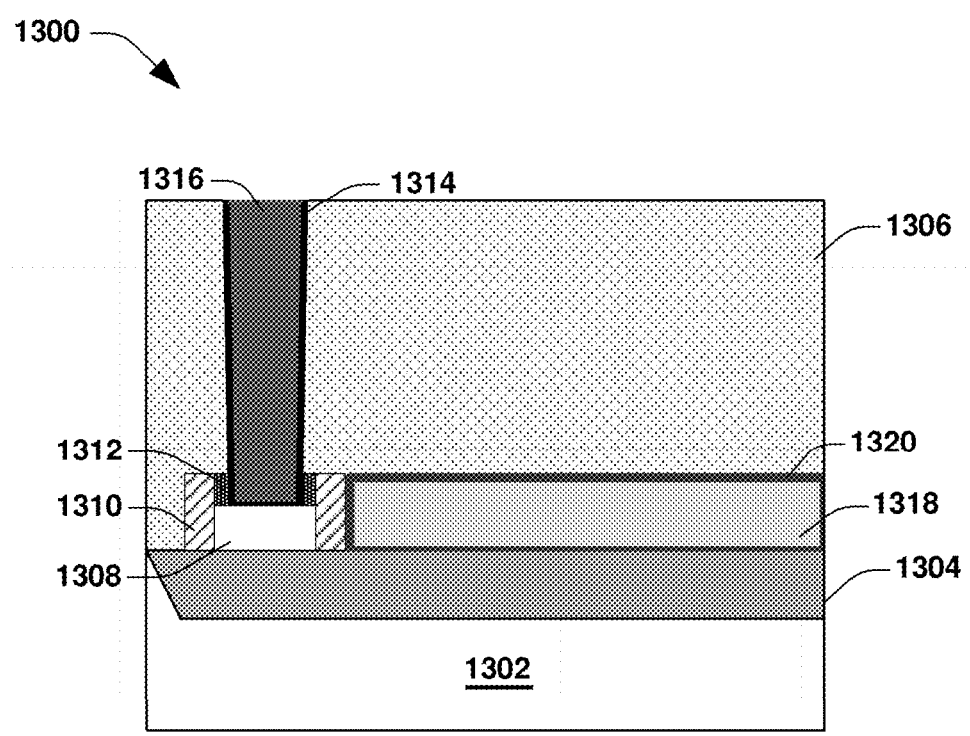
FIG. 13 is an illustration of a semiconductor arrangement, according to some embodiments.

FIG. 13 is an illustration of a semiconductor arrangement 1300, according to some embodiments. The semiconductor arrangement 1300 may comprise a feature of a logic device, a memory device, or other electronic device. The semiconductor arrangement 1300 is formed on and/or includes a substrate 1302, at least one of a first dielectric layer or a semiconductor layer 1304, a second dielectric layer 1306 formed over the first dielectric layer/semiconductor layer 1304, and a third dielectric layer 1318 formed between the first dielectric layer/semiconductor layer 1304 and the second dielectric layer 1306. According to some embodiments, the first dielectric layer/semiconductor layer 1304 comprises at least one of a dielectric material or a semiconductor material. The first dielectric layer/semiconductor layer 1304 may comprise a silicon germanium channel.

A plasma enhanced silicon nitride layer 1320 is formed around the third dielectric layer 1318. The semiconductor arrangement 1300 includes a gate material 1308 formed over the first dielectric layer/semiconductor layer 1304, and a spacer 1310, such as SiON, SiOCN, formed adjacent to the gate material 1308. A mask layer 1312, such as SiN, is formed between the spacer 1310 and a vertical interconnect access (VIA) structure 1316. The VIA structure 1316 is formed over an adhesion layer 1314. A material of the adhesion layer 1314 is a same material as a material of the VIA structure 1316. The adhesion layer 1314 and the VIA structure 1316 may be formed in accordance with the intermediate stages of the method for forming the semiconductor arrangement 100 of FIGS. 7-10.

Figure 14:
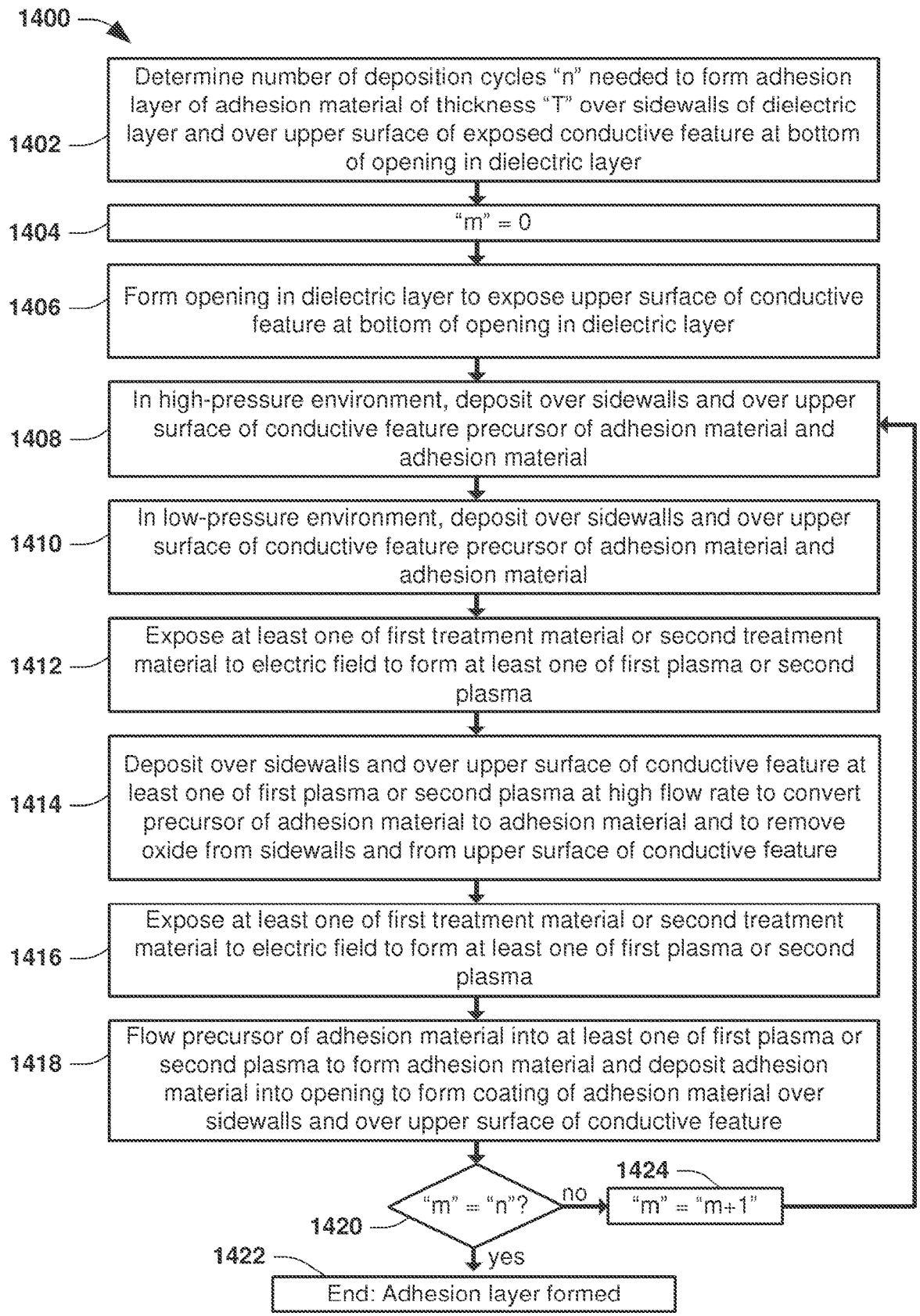
FIG. 14 is an illustration of a method of making a semiconductor arrangement, according to some embodiments.

FIG. 14 is an illustration of a method of making a semiconductor arrangement, according to some embodiments. A method (1400) of making a semiconductor arrangement comprises determining a number of deposition cycles "n" needed to form an adhesion layer of an adhesion material having a thickness "T" over sidewalls of a dielectric layer and over an upper surface of an exposed conductive feature at a bottom of an opening defined by the sidewalls of the dielectric layer (1402). A cycle variable "m" is set to zero (1404). The opening is formed in the dielectric layer to expose the upper surface of the conductive feature at the bottom of the opening in the dielectric layer (1406). In a high-pressure environment, a precursor of the adhesion material and the adhesion material is deposited over the sidewalls and over the upper surface of the conductive feature (1408). In a low-pressure environment, the precursor of the adhesion material and the adhesion material is deposited over the sidewalls and over the upper surface of the conductive feature (1410). At least one of a first treatment material or a second treatment material is exposed to an electric field to form at least one of a first plasma or a second plasma (1412). At least one of the first plasma or the second plasma is deposited over the sidewalls and over the upper surface of the conductive feature at a high flow rate to convert the precursor of the adhesion material to the adhesion material and to remove oxides from the sidewalls and from the upper surface of the conductive feature (1414). At least one of the first treatment material or the second treatment material is exposed to an electric field to form at least one of the first plasma or the second plasma (1416). A precursor of the adhesion material is flowed into at least one of the first plasma or the second plasma to form the adhesion material and deposit the adhesion material into the opening to form a coating of the adhesion material over the sidewalls and the upper surface of the conductive feature (1418). Determine whether "m" is equal to "n" (1420). If "m" is equal to "n", the method may end (1422). If "m" is not equal to "n", "m" is increased by one (1424) and the method resumes (1408).

According to some embodiments, the precursor of the adhesion material comprises CO ligands attached to an adhesion atom or molecule, such as W, the precursor of the adhesion material is $W(CO)_6$, the first treatment material is Ar, the second treatment material is $H_2$, the first plasma comprises ionized Ar, and the second plasma comprises ionized $H_2$.

Figure 15:
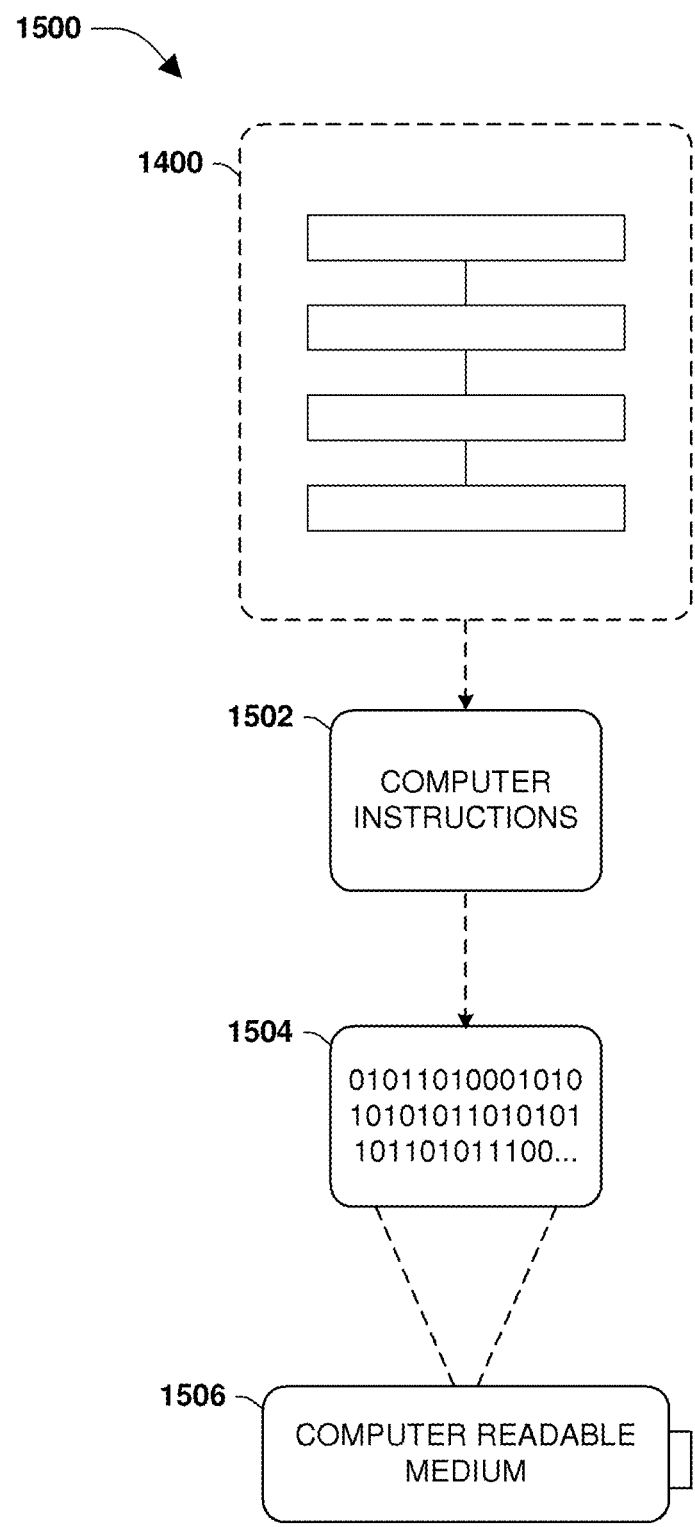
FIG. 15 illustrates an exemplary computer-readable medium, according to some embodiments.

FIG. 15 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 15, wherein the embodiment 1500 comprises a computer-readable medium 1506 (e.g., a CD-R, DVD-R, flash drive, a platter of a hard disk drive, etc.), on which is encoded computer-readable data 1504. This computer-readable data 1504 in turn comprises a set of processor-executable computer instructions 1502 that when executed are configured to facilitate operations according to one or more of the principles set forth herein. In some embodiments 1500, the processor-executable computer instructions 1502 are configured to facilitate performance of a method 1400, such as at least some of the aforementioned method(s). In some embodiments, the processor-executable computer instructions 1502 are configured to facilitate implementation of a system, such as at least some of the one or more aforementioned system(s). Many such computer-readable media may be devised by those of ordinary skill in the art that are configured to operate in accordance with the techniques presented herein.

As disclosed, the width of a conductive layer formed over an adhesion layer of the same material as the material of the conductive layer may be greater than a width of a conductive layer formed over an adhesion layer of a different material as the material of the conductive layer. A conductive layer formed over an adhesion layer of a different material requires a barrier layer between the adhesion layer and the conductive layer. The barrier layer consumes volume of the opening in which the conductive layer is formed, thereby confining the width of the conductive layer. In contrast, a conductive layer formed over an adhesion layer of the same material does not require a barrier layer between the adhesion layer and the conductive layer. Thus, the conductive layer may be formed directly over the adhesion layer to a thickness that is greater than a thickness of a conductive layer formed over an adhesion layer of a different material. Because a thicker conductive layer has greater conductivity, device performance, reliability, and yield are greater than in devices having thinner conductive layers.

According to some embodiments, a semiconductor arrangement includes a dielectric layer defining an opening, an adhesion layer in the opening, and a conductive layer in the opening over the adhesion layer. A material of the conductive layer is a same material as an adhesion material of the adhesion layer.

According to some embodiments, the semiconductor arrangement includes a conductive feature exposed through the opening, and the conductive layer overlies the conductive feature.

According to some embodiments, at an interface of the conductive feature and the conductive layer, a ratio of oxygen to a material of the conductive feature is less than 1:2.

According to some embodiments, a conductive feature is exposed through the opening and the adhesion layer overlies the conductive feature.

According to some embodiments, the adhesion layer is in direct contact with the conductive feature.

According to some embodiments, the opening is defined by a first sidewall of the dielectric layer and a second sidewall of the dielectric layer.

According to some embodiments, the adhesion layer is in direct contact with at least one of the first sidewall or the second sidewall.

According to some embodiments, the adhesion layer includes tungsten and the conductive layer includes tungsten.

According to some embodiments, between 55 to 75 percent of a volume of the opening is occupied by the conductive layer.

According to some embodiments, a method of forming a semiconductor arrangement includes forming an opening in a dielectric layer, wherein the opening is defined by a first sidewall of the dielectric layer and a second sidewall of the dielectric layer, coating the first sidewall and the second sidewall with a material including metal and oxygen, and removing the oxygen from the material so that an adhesion layer including the metal is on the first sidewall and the second sidewall.

According to some embodiments, a method of forming a semiconductor arrangement includes forming a conductive layer in the opening over the adhesion layer.

According to some embodiments, the metal is tungsten and forming the conductive layer includes filling the opening with tungsten.

According to some embodiments, removing the oxygen includes exposing the material to a plasma.

According to some embodiments, the plasma is generated from molecular hydrogen in an electric field.

According to some embodiments, the material includes a molecule including a metal atom and an oxygen atom and the plasma separates the oxygen atom from the metal atom.

According to some embodiments, the molecule is tungsten hexacarbonyl.

According to some embodiments, a method of forming a semiconductor arrangement includes forming an opening in a dielectric layer to expose a conductive feature underlying the dielectric layer, wherein the opening is defined by a first sidewall of the dielectric layer and a second sidewall of the dielectric layer, coating the first sidewall and the second sidewall with an adhesion layer, and forming a conductive layer in the opening over the adhesion layer, wherein at an interface of the conductive feature and the conductive layer, a ratio of oxygen to a material of the conductive feature is less than 1:2.

According to some embodiments, coating the first sidewall and the second sidewall includes coating the first sidewall and the second sidewall with a material including metal and oxygen and removing the oxygen from the material to form the adhesion layer.

According to some embodiments, the adhesion layer includes metal and forming the conductive layer includes filling the opening with the metal.

According to some embodiments, coating the first sidewall and the second sidewall includes exposing, under a pressure of at least 12 torr, the dielectric layer to the material in a gaseous state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
    forming an opening in a dielectric layer, wherein the opening is defined by a first sidewall of the dielectric layer and a second sidewall of the dielectric layer;
    coating the first sidewall and the second sidewall with a material comprising metal and oxygen; and
    removing the oxygen from the material so that an adhesion layer comprising the metal is on the first sidewall and the second sidewall, wherein removing the oxygen comprises exposing the material to a plasma.

2. The method of claim 1, comprising forming a conductive layer in the opening over the adhesion layer.

3. The method of claim 2, wherein the metal is tungsten and forming the conductive layer comprises filling the opening with tungsten.

4. The method of claim 1, wherein the plasma is generated from molecular hydrogen in an electric field.

5. The method of claim 1, wherein the material comprises a molecule comprising a metal atom and an oxygen atom and the plasma separates the oxygen atom from the metal atom.

6. The method of claim 5, wherein the molecule is tungsten hexacarbonyl.

7. The method of claim 1, wherein coating the first sidewall and the second sidewall comprises exposing, under a pressure of at least 12 torr, the dielectric layer to the material in a gaseous state.

8. The method of claim 1, wherein the plasma comprises ionized argon.

9. The method of claim 1, wherein the plasma comprises ionized hydrogen.

10. The method of claim 1, wherein the plasma comprises ionized argon and ionized hydrogen.

11. The method of claim 1, wherein:
    forming the opening comprises forming the opening to expose a top surface of a conductive feature, and
    the method comprises coating the top surface of the conductive feature with the material.

12. The method of claim 1, wherein:
removing the oxygen from the material yields a first adhesion coating,
the method comprises:
  coating the first adhesion coating with a second instance of the material; and
  removing oxygen from the second instance of the material to yield a second adhesion coating, and
the first adhesion coating and the second adhesion coating are part of the adhesion layer.

13. A method of forming a semiconductor arrangement, comprising:
  forming an opening in a dielectric layer, wherein the opening is defined by a first sidewall of the dielectric layer and a second sidewall of the dielectric layer;
  coating the first sidewall and the second sidewall with a material comprising metal and oxygen; and
  removing the oxygen from the material so that an adhesion layer comprising the metal is on the first sidewall and the second sidewall, wherein removing the oxygen comprises exposing the material to a first plasma and a second plasma.

14. The method of claim 13, wherein the first plasma comprises ionized argon.

15. The method of claim 13, wherein the second plasma comprises ionized hydrogen.

16. The method of claim 13, wherein:
forming the opening comprises forming the opening to expose a top surface of a conductive feature, and
the method comprises coating the top surface of the conductive feature with the material.

17. The method of claim 13, wherein:
removing the oxygen from the material yields a first adhesion coating,
the method comprises:
  coating the first adhesion coating with a second instance of the material; and
  removing oxygen from the second instance of the material to yield a second adhesion coating, and
the first adhesion coating and the second adhesion coating are part of the adhesion layer.

18. A method of forming a semiconductor arrangement, comprising:
  forming an opening in a dielectric layer, wherein the opening is defined by a first sidewall of the dielectric layer, a second sidewall of the dielectric layer, and a top surface of a conductive feature;
  coating the first sidewall, the second sidewall, and the top surface with a material comprising metal and oxygen; and
  removing the oxygen from the material so that an adhesion layer comprising the metal is on the first sidewall, the second sidewall, and the top surface, wherein removing the oxygen comprises exposing the material to a plasma.

19. The method of claim 18, wherein the plasma comprises ionized argon.

20. The method of claim 18, wherein the plasma comprises ionized hydrogen.

* * * * *